US008680863B1

(12) United States Patent
Qian et al.

(10) Patent No.: US 8,680,863 B1
(45) Date of Patent: Mar. 25, 2014

(54) DOUBLE RESONANCE MRI COIL DESIGN

(75) Inventors: Chunqi Qian, Tallahassee, FL (US);
Peter Gor'kov, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 549 days.

(21) Appl. No.: 12/952,692

(22) Filed: Nov. 23, 2010

Related U.S. Application Data

(60) Provisional application No. 61/264,033, filed on Nov. 24, 2009.

(51) Int. Cl.
G01V 3/00 (2006.01)
G01R 33/48 (2006.01)

(52) U.S. Cl.
USPC ........... 324/318; 324/307; 324/309; 324/322; 600/410

(58) Field of Classification Search
USPC ................................. 324/300–322
See application file for complete search history.

(56) References Cited

U.S. PATENT DOCUMENTS

| | | | |
|---|---|---|---|
| 4,916,418 A | 4/1990 | Rath | |
| 4,992,737 A * | 2/1991 | Schnur | 324/318 |
| 5,212,450 A * | 5/1993 | Murphy-Boesch et al. | 324/322 |
| 6,100,694 A | 8/2000 | Wong | |
| 6,377,047 B1 | 4/2002 | Wong et al. | |
| 6,396,271 B1 * | 5/2002 | Burl et al. | 324/318 |
| 6,452,393 B1 | 9/2002 | Allen et al. | |
| 6,825,660 B2 | 11/2004 | Boskamp | |
| 8,035,384 B2 * | 10/2011 | Saha | 324/318 |
| 2006/0012370 A1 * | 1/2006 | Barberi | 324/318 |

* cited by examiner

Primary Examiner — Jermele M Hollington
Assistant Examiner — Emily Chan
(74) Attorney, Agent, or Firm — Andriy Lytvyn; Smith & Hopen, P.A.

(57) ABSTRACT

A four-ring birdcage coil having at least one moveable tuning ring for double resonance MRI includes low-pass configuration in both channels so that the HF mode only requires a small capacitance for resonance, enabling easy modification of a single resonance coil into a double resonance coil by incorporation of non-contact coupling rings whose capacitive coupling with the rungs generates enough capacitance to introduce the high-frequency resonance mode. The coil also includes at least one moving ring for broad range tuning in the HF channel. The LF channel is adjusted by a variable capacitor that is not directly connected to the coil, thus the frequency adjustment on each channel is independent. The HF channel is connected to the input cable by coupling capacitor. The LF channel is connected to the input cable by coupling inductor. This alternating driving scheme provides sufficient channel isolation and obviates the need for an external isolation network.

16 Claims, 4 Drawing Sheets

DOUBLE RESONANCE MRI COIL DESIGN

CROSS-REFERENCE TO RELATED APPLICATIONS

This application claims priority to U.S. Provisional Patent application No. 61/264,033, entitled "A CONVENIENT DOUBLE RESONANCE MRI COIL DESIGN," filed on Nov. 24, 2009, the contents of which are hereby incorporated by reference.

GOVERNMENT SUPPORT

This invention was made with government support under Grant No. DMR 06-54118 awarded by the National Science Foundation. The government has certain rights in the invention.

BACKGROUND OF THE INVENTION

1. Field of the Invention

This invention relates to magnetic resonance imaging (MRI). More specifically, it relates to a four-ring birdcage coil having at least one tuning ring for double resonance MRI.

2. Description of the Prior Art

Birdcage coils for magnetic resonance apparatuses are generally known. In magnetic resonance systems, birdcage coils are used as transmission elements for excitation of magnetic resonances. Furthermore, they are also used as whole-body reception elements for magnetic resonance systems as well as, in some cases, local coils (for example as head coils).

A shortcoming of some conventional double-tuned birdcage coils, including those described by Murphy-Boesch et al. J. Mag. Res., vol. 103, pp. 103-114 (1994), is the difficulty in tuning the resonant frequencies. Conventional double-tuned birdcage coils have dependent tuning. An example of a double-tuned birdcage coil is described in U.S. Pat. No. 4,916,418, where two different sets of capacitors are in the path of both the low and high frequency currents, and adjusting one set of capacitances affects both low and high resonant frequencies. Thus, the double-tuned birdcage coils are dependently tuned such that more than one set of capacitances on the coil must be adjusted to tune either the lower or higher frequency, and significant amounts of time may be required for an iterative tuning procedure.

U.S. Pat. No. 6,100,694 uses a combination of low-pass and high-pass configuration to achieve double resonance operation. Because the high-pass configuration requires more capacitance, it is difficult to use distributed capacitance in the design and difficult to construct a double resonance coil based on the modification of a single resonance coil by the introduction of coupling rings.

Thus, what is needed is a double-tuned birdcage coil that may be conveniently tuned to cover a large frequency range. What is also needed is a multiply tuned birdcage coil that has independent tuning on each channel. Moreover, what is needed is a way to easily construct a double resonance coil based on the modification of a single resonance coil.

SUMMARY OF INVENTION

Generally speaking, the claimed invention is a four-ring birdcage coil having at least one tuning ring for double resonance MRI. The apparatus includes a cylindrical birdcage coil having a pair of opposed outer rings, a pair of opposed inner rings, and a plurality of equally spaced vertical legs, with the inner rings being disposed between or within the outer rings. The pair of opposed outer rings are connected to the plurality of equally spaced vertical legs via a plurality of capacitors. The pair of opposed inner rings are coupled to the plurality of vertical legs through distributed capacitance. The cylindrical birdcage coil is constructed around a cylindrical coil former, and a concentric Faraday shield is disposed around the cylindrical birdcage coil.

At least one tuning ring is disposed within the cylindrical birdcage coil. The tuning ring(s) may be movable in all direction within the cylindered birdcage, may rotate, or may be affixed in a specific location. By varying the position of the mobile tuning ring(s), the effective coupling between the cylindrical birdcage coil and the tuning ring(s) can be varied and thus the coil's resonance frequency varied. This tuning scheme is effective for the high operating frequency where the $B_1$ homogeneity can be preserved over a broad range of sample loads. The adjustment at the high frequency channel will not affect the resonance of the low frequency channel. The resonance at the low operating frequency is adjusted by a variable capacitor shunt connected to a separate coupling inductor. Because the coupling inductor is effectively interacting with the birdcage coil only at the low operating frequency, the adjustment at the low frequency channel will not affect the resonance of the high frequency channel.

In a first embodiment, at least one tuning ring is disposed within the cylindrical birdcage coil.

In a second embodiment, a pair of diametrically opposed tuning rings is disposed within the cylindrical birdcage coil at a first location coplanar to the pair of diametrically opposed outer rings, respectively.

In a third embodiment, a pair of diametrically opposed tuning rings is disposed within the cylindrical birdcage coil at a second location coplanar to the pair of diametrically opposed inner rings, respectively.

In a fourth embodiment, a pair of diametrically opposed tuning rings is concentrically adjustable within the cylindrical birdcage resonator between the outer ring and the inner ring, respectively, with the pair of diametrically opposed tuning rings moving simultaneously in opposite directions.

In a fifth embodiment, a pair of diametrically opposed tuning rings is disposed within the cylindrical birdcage resonator and includes one fixed ring and one concentrically moving ring.

In a sixth embodiment, the inner rings and the outer rings are coplanar but of different radiuses. A pair of diametrically opposed tuning rings is adjustably disposed within the cylindrical birdcage coil. The tuning rings move in opposite directions, with the tuning rings having different degrees of overlap with the coplanar inner rings. This allows equal fields of view for both low- and high-frequency channels along the coil's axis.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
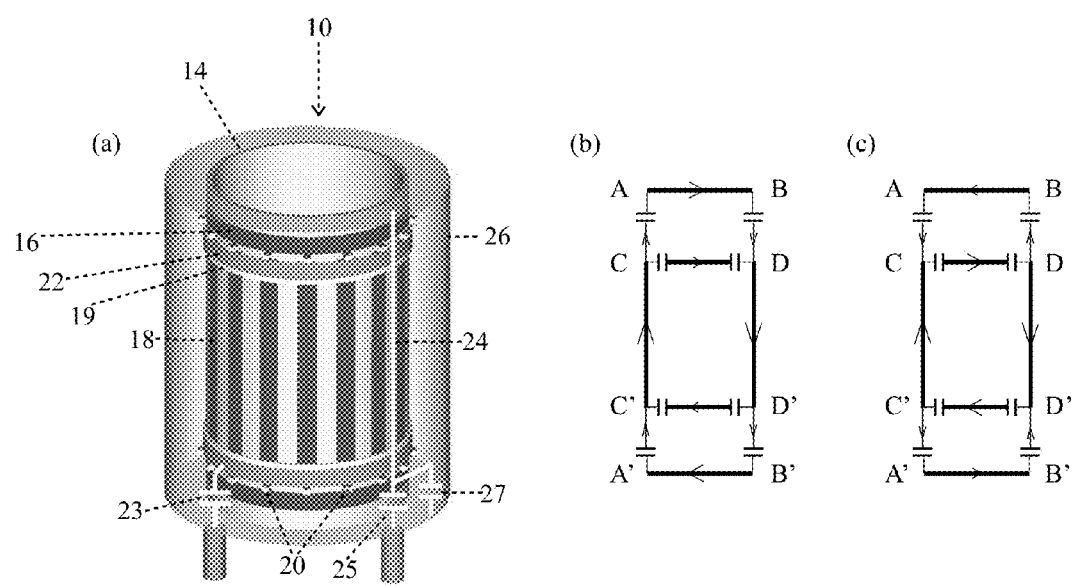
FIG. 1(a) is a geometric diagram of a four-ring birdcage coil with no tuning rings.
FIG. 1(b) is the circuit diagram of an individual mesh at the low operating frequency, where the inner ring and the outer ring have the same current direction.
FIG. 1(c) shows the inner ring and outer ring having opposite current directions at high operating frequency.

FIG. 1(a) is the geometric diagram of a four-ring birdcage, coil, generally denoted as number 10, with no tuning rings. The coil 10 is constructed from conductive strips disposed on the surface of dielectric cylindrical former 14. The outer rings 16 are connected to the legs 18 through a series of chip capacitors 20. The inner rings 22 are wrapped around the legs 18 with thin layer of dielectric 19 sandwiched in between.

Still referring to FIG. 1(a), the high frequency (HF) channel is fed on the inner ring by connecting it to the center conductor of the input cable via a matching capacitor 23. The low frequency (LF) channel is fed inductively by an inductor wire 24 that is serially connected to the input cable via a matching capacitor 25. The current path through the inductor wire is shunted by the low frequency channel tuning capacitor 27 to the ground. The entire coil assembly is enclosed in a grounded cylindrical shield 26.

Figure 2:
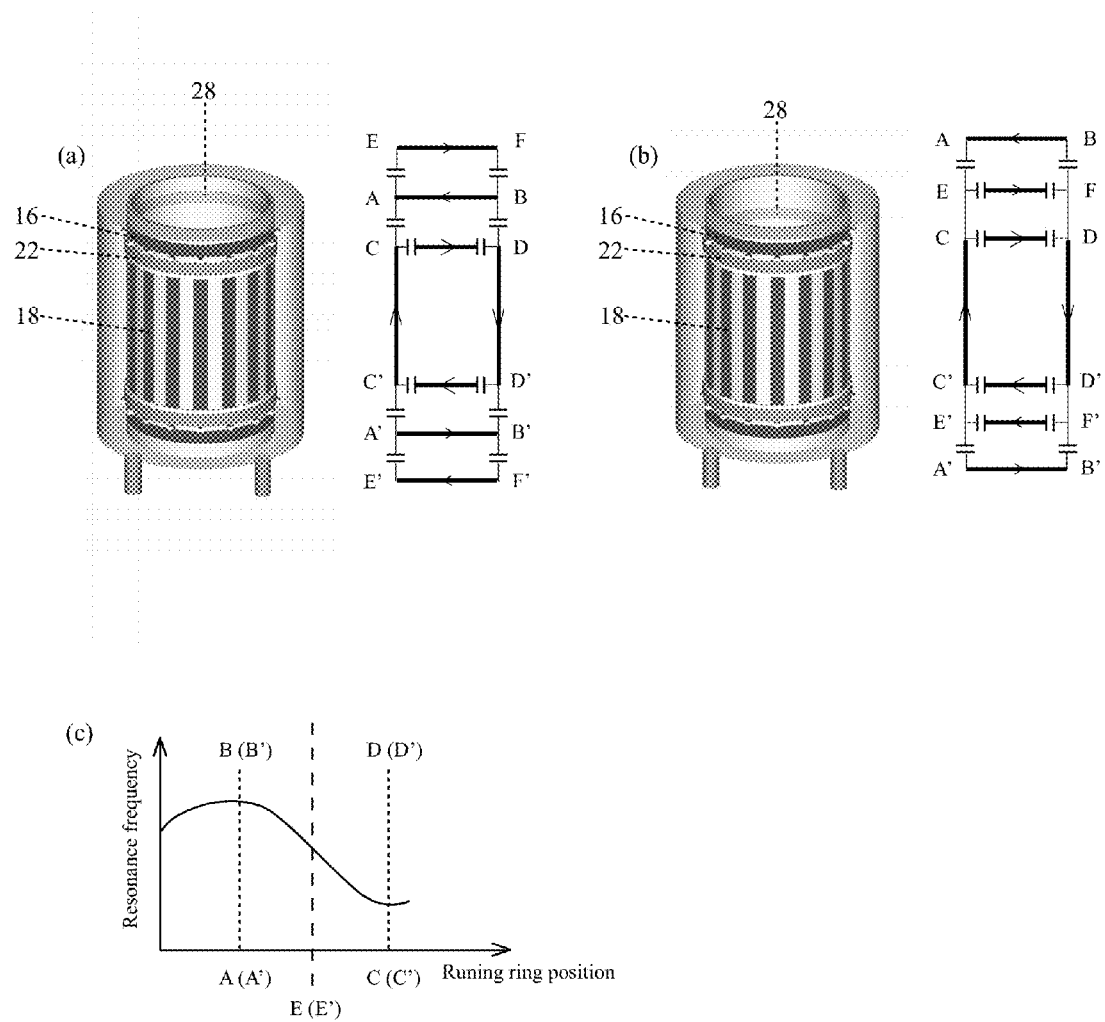
FIG. 2(a) is the geometric diagram of the four-ring birdcage coil with a tuning ring coplanar with the outer ring.
FIG. 2(b) shows the diagram of the four-ring birdcage coil with the tuning ring coplanar with the inner.
FIG. 2(c) is a graph showing the dependence of the coil's resonance frequency on the position of the tuning rings.

The coil has low-pass configuration in both channels so that the high frequency mode only requires a small capacitance for resonance. This feature enables easy modification of a single resonance coil into a double resonance coil by incorporation of non-contact coupling rings 22 (inner rings) whose capacitive coupling with the rungs generates enough capacitance to introduce the high-frequency resonance mode. The coil 10 also uses at least one additional moving (refer to component 28 in FIG. 2) for broad range tuning in the HF channel and greatly simplifies the process for resonance frequency adjustment. The HF channel is connected to the input cable by coupling capacitor 23. The LF channel is connected to the input cable by coupling inductor 24. This alternating driving scheme provides sufficient channel isolation and obviates the need for an external isolation network.

FIG. 1(b) is the circuit diagram of an individual mesh at the low operating frequency, where the inner ring CD and the outer ring AB have the same current direction. Conversely, as shown in FIG. 1(c), at the high operating frequency, the inner ring CD and outer ring AB have opposite current directions.

In the geometric diagram of the birdcage coil 10, as shown in FIG. 2(a), the tuning rings 28 are coplanar with the outer rings 16 of the four-ring birdcage and couple inductively with the outer rings 16. This inductive coupling generates counter rotating currents between the tuning rings and the outer rings; thus decreasing the effective inductance of the outer rings 16 and increasing the coil's 10 resonance frequency. The circuit diagram on the right in FIG. 2(a) shows the loop current direction within an individual mesh. AB corresponds to the outer ring 16, CD corresponds to the inner ring 22, and EF corresponds to the tuning ring 28. Line CC' and DD' correspond to the legs 18.

In FIG. 2(b), the tuning ring 28 is coplanar with the inner ring 22 and couples capacitively with the legs 18. As shown in the circuit diagram on the right in FIG. 2(b), this capacitive coupling generates co-rotating currents between the tuning ring 28 and the inner ring 22, thus decreasing the coil's 10 resonance frequency.

FIG. 2(c) graphically demonstrates the dependence of the coil's resonance frequency on the position of the tuning rings. When the tuning rings EF are moving away from the outer rings AB towards the inner ring CD, the resonance frequency decrease from the maximum to the minimum. And this is the region where frequency tuning is most effective.

Figure 3:
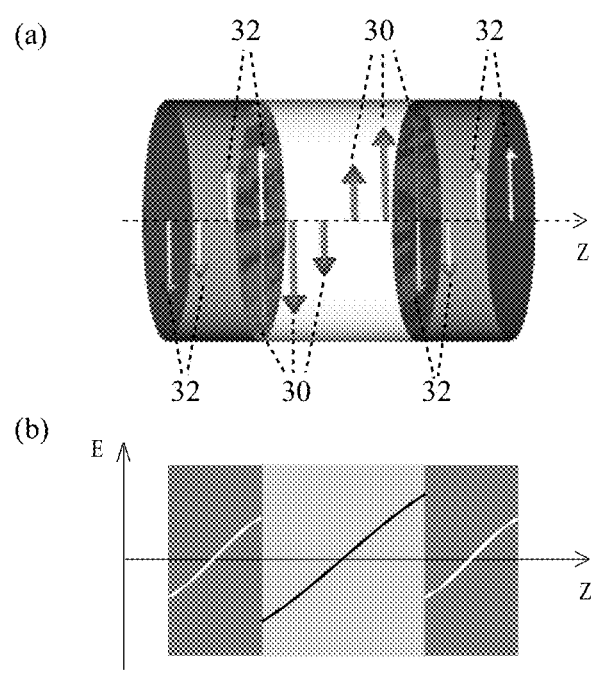
FIG. 3(a) illustrates the schematic diagram of the electric field distribution along the cylindrical axis of the four-ring birdcage coil.
FIG. 3(b) shows that the E-field generated by each unit has a sinusoidal intensity profile along the Z-axis.

FIGS. 3(a) and (b) illustrate the reduced penetrating electric field of the four-ring birdcage coil in its high frequency resonance mode. In the geometrical diagram in FIG. 3(a), the entire coil can be viewed as three individual coils placed in a row. The arrows 30 represent the E-field generated by the center unit, while the arrows 32 represent the E-field generated by the left and right units. The E-field generated by each unit has a sinusoidal intensity profile along the Z-axis, as is shown by FIG. 3(b), with the positive and negative maxima positioned at its two opposite ends. Because the adjacent coils have opposite current directions with respect to each other, the electric field generated by the center unit is partially cancelled by the E-field from coils on both sides. This reduced penetrating electric field in the coil is advantageous for physiologically relevant samples with high dielectric loss.

Figure 4:
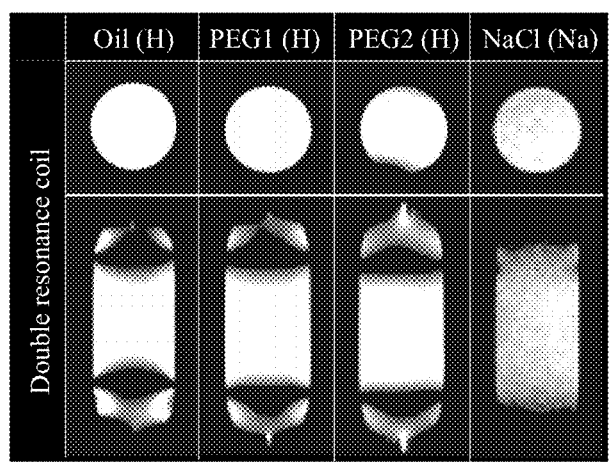
FIG. 4 is the image obtained by the double resonance coil under different sample loading conditions.

FIG. 4 is the image obtained by the double resonance coil under different sample loading conditions. In this particular demonstration, the higher frequency channel is tuned to $^1$H proton resonance (900 MHz) and the lower frequency channel is tuned to $^{23}$Na sodium resonance (237 MHz). Three phantoms are used to test the proton channel. The first sample, the mineral oil represents very light load or virtually no load. The second sample PEG1 phantom, containing 61% (w/v) polyethylene glycol and 40 mM NaCl in $D_2O$ solution, approximated the frequency shifts and the loading effect produced by the heads of young rats (150-200 g). And the third sample PEG2 phantom, which mimicked the loading by the heads of even larger adult rats, contained 28% (w/v) PEG and 23 mM NaCl. For the proton images in the left three columns, the multi-slice fast spin echo images were obtained for each combination of coil and phantom in transverse and longitudinal directions. When compared to single resonance birdcages, this double-resonance coil can be made to retain >95% of sensitivity in the sodium channel and nearly all sensitivity in the proton channel (though the FOV of the proton channel is somewhat shorter in axial direction than that of a single-resonance $^1$H coil if the inner rings and outer rings are not coplanar). And the double resonance coil has good transverse homogeneity over a big range of sample loads, due to the symmetric tuning mechanism by the moveable ring. These favorable properties can facilitate the unambiguous co-registration of multi-nuclei images.

It will thus be seen that the objects set forth above, and those made apparent from the foregoing disclosure, are efficiently attained. Since certain changes may be made in the above construction without departing from the scope of the invention, it is intended that all matters contained in the foregoing disclosure or shown in the accompanying drawings shall be interpreted as illustrative and not in a limiting sense.

It is also to be understood that the following claims are intended to cover all of the generic and specific features of the invention herein disclosed, and all statements of the scope of the invention that, as a matter of language, might be said to fall therebetween.

What is claimed is:

1. An apparatus for double resonance MRI, comprising:
   a cylindrical birdcage coil having a pair of opposed outer rings and a pair of opposed inner rings connected to a plurality of equally spaced vertical legs collectively forming a double resonant coil;

at least one tuning ring disposed within said cylindrical birdcage coil inductively coupled with at least one said outer ring, said tuning ring configured to decrease an effective inductance of said outer ring thereby adjusting a resonance frequency of said double resonant coil responsive to a positional change of said tuning ring;

said pair of opposed inner rings being disposed between said pair of opposed outer rings; and said at least one tuning ring being a pair of opposed tuning rings each being adjustable within said cylindrical birdcage coil between said outer ring and said inner ring, respectively.

2. An apparatus for double resonance MRI as in claim 1, further comprising:

said pair of opposed inner rings being disposed within said pair of opposed outer rings, respectively, whereby said pair of opposed inner rings are coplanar with said pair of opposed outer rings, respectively.

3. An apparatus for double resonance MRI as in claim 2, further comprising:

said at least one tuning ring being a pair of diametrically opposed tuning rings that move within said cylindrical birdcage coil in opposite directions, said pair of diametrically opposed tuning rings having different degrees of overlap with said coplanar inner rings a disk-shaped beam stop to produce an annular beam of said first light source with a larger inside diameter.

4. An apparatus for double resonance MRI as in claim 1, further comprising:

said at least one tuning ring being a pair of opposed tuning rings disposed within said cylindrical birdcage coil.

5. An apparatus for double resonance MRI as in claim 1, further comprising:

said cylindrical birdcage coil being constructed around a coil former.

6. An apparatus for double resonance MRI as in claim 5, further comprising:

said at least one tuning ring being adjustably disposed within said coil former.

7. An apparatus for double resonance MRI as in claim 1, further comprising:

said plurality of equally spaced vertical legs being connected to said pair of opposed outer rings via a plurality of capacitors.

8. An apparatus for double resonance MRI as in claim 1, further comprising:

a shield disposed around said cylindrical birdcage coil.

9. An apparatus for double resonance MRI as in claim 1, further comprising:

said at least one tuning ring being a pair of opposed tuning rings disposed within said cylindrical birdcage coil at a first location coplanar to said pair of opposed outer rings, respectively.

10. An apparatus for double resonance MRI as in claim 1, further comprising:

said at least one tuning ring being a pair of opposed tuning rings disposed within said cylindrical birdcage coil at a second location coplanar to said pair of opposed inner rings, respectively.

11. An apparatus for double resonance MRI as in claim 1, further comprising:

said at least one tuning ring being a pair of opposed tuning rings having one fixed ring and one adjustable ring disposed within said cylindrical birdcage coil.

12. An apparatus for double resonance MRI as in claim 1, further comprising:

said pair of opposed tuning rings move in opposite directions simultaneously.

13. An apparatus for double resonance MRI as in claim 1, further comprising:

a high frequency channel from an input cable is connected to said inner ring via a coupling capacitor.

14. An apparatus for double resonance MRI as in claim 1, further comprising:

a low frequency channel is fed inductively by an inductor wire that is serially connected to an input cable via a matching capacitor.

15. An apparatus for double resonance MRI as in claim 14, further comprising:

a current path through said inductor wire is shunted by a low frequency channel tuning capacitor to the ground.

16. An apparatus for double resonance MRI as in claim 1, further comprising:

said inner rings being non-contact coupling rings.

* * * * *